United States Patent [19]

Kroll et al.

[11] Patent Number: 4,923,576

[45] Date of Patent: May 8, 1990

[54] ADDITIVES FOR ELECTROPLATING COMPOSITIONS AND METHODS FOR THEIR USE

[75] Inventors: Harry Kroll, East Greenwich; Florence Butler, Smithfield; Therese R. Souza, Cranston, all of R.I.

[73] Assignee: Technic, Inc., Cranston, R.I.

[21] Appl. No.: 215,749

[22] Filed: Jul. 6, 1988

[51] Int. Cl.$^5$ .......................... C25D 3/56; C25D 3/60
[52] U.S. Cl. .................................................... 204/44.4
[58] Field of Search ........................................ 204/44.4

[56] References Cited

U.S. PATENT DOCUMENTS 4,000,047 12/1976 Ostrow et al. ..................... 204/44.4
4,673,470 6/1987 Obata et al. ........................ 204/44.4

FOREIGN PATENT DOCUMENTS 0172267 2/1986 European Pat. Off. .

Primary Examiner—G. L. Kaplan
Attorney, Agent, or Firm—Ostrolenk, Faber, Gerb & Soffen

[57] ABSTRACT

Heteroaromatic compounds having at least two nitrogen atoms may be used to regulate consistency of alloy content and of deposit thickness. Modified nonionic surfactants which lack terminal hydroxy groups are used as grain refiners having low tendency to cause foam build-up in electroplating baths. Dioxolanes may be used to produce deposits having, as desired, a white uniform matte, a semi-bright plate, or a mirror bright surface.

20 Claims, No Drawings 4,923,576

ADDITIVES FOR ELECTROPLATING COMPOSITIONS AND METHODS FOR THEIR USE

BACKGROUND OF THE INVENTION

Field of the Invention

This invention relates to additives for electroplating baths which enhance the quality of electroplated products and improve the efficiency and safety of the electroplating process. In particular, the invention relates to additives which suppress the build-up of foam in the electroplating bath during mass production, and to additives which control the thickness and content of the deposit over a wide range of current densities, and to additives which act as brighteners. The additives are particularly useful, for instance, in alloy systems such as a tin/lead electroplating baths.

Automatic plating lines for printed circuit boards and connectors have introduced new requirements into the properties of industrial electroplating baths. This is especially true, for instance, for solutions used in producing alloy deposits such as a tin/lead alloy in a continuous on-line mode. A typical apparatus for conducting such electroplating consists of a reservoir holding the plating solution, a tank where the electroplating is done, and a pump which propels the plating solution from the reservoir to the plating tank. The plating solution is usually returned to the reservoir to complete a circuit. Work pieces may be moved through the plating tank on a conveyor belt at a regulated speed and at a current density commensurate with the acceptable alloy deposit.

For economic reasons, the automatic line carrying the work pieces should preferably move at a high speed and at elevated current densities. When work pieces are moving through the system at such a high rate, the plating solution should preferably be pumped rapidly through the system as well. Such high speed pumping agitates the solution and, due to the prior art additives used in the bath, may generate undesirably high quantities of foam. For instance, commercial tin/lead electroplating solutions formulated in recent years usually contain nonionic surfactants based on polyethylene oxide, and/or poly(ethylene/propylene) oxide copolymers. These surface active agents act as grain refiners and wetting agents. However, solutions containing such nonionic surfactants may build up stable foams in undesirable quantities when subjected to the aeration and agitation that is common in most high-speed commercial mass production systems.

In an automatic plating line, the usual pumping action so agitates the plating solution that foam is generated to an extent capable of overflowing the holding tank. This may result in an economically detrimental loss of plating solution. Such foaming and loss of plating solution may be reduced by slowing down the plating process, but at the expense of lost productivity. Prior art attempts to solve the foaming problem without reducing speed have included addition of anti-foaming agents which, while effective in reducing foam, may undesirably introduce impurities into the deposit.

During electroplating, the work pieces may have variations in current density along their platable surfaces due to variations in surface geometries and the like. This may cause variations in the depth of the deposited plate, or in some instances involving alloys, variations in the ratios of metals deposited in the plate. For instance, in tin/lead electroplating, higher lead content may be observed in areas having low current density relative to areas having higher current density. Many articles, such as printed circuit boards, go through a fusion or reflow process after alloy plating During this process, dissimilarities in alloy composition may produce an undesirable roughness in the fused coatings. Also, areas of high current density during electroplating will tend to have deposit thicknesses greater than those of low density areas. These differences in thicknesses are inappropriate in many contexts U.S. Pat. No. 4,000,047 discloses a bath for electrodeposition of bright tin/lead alloys having, among other things, certain specified pyridines and quinolines. U.S. Pat. No. 4,388,161 discloses preparation of bright tin/lead alloy deposits by electrocoating using a bath having, among other things, certain halomethyl substituted dioxolanes which are further substituted by a specified phenyl, naphthyl or pyridyl radical.

In U.S. Pat. No. 4,555,314, long chain alkyl guanamines are disclosed for regulating tin/lead ratios during electrodeposition of tin/lead alloys U.S. Pat. No. 4,565,609 describes the use of high molecular weight quaternized 2-alkyl imidazolinium salts for similar purposes U.S. Pat. No. 4,459,185 discloses the use of high molecular weight cationic compositions in conjunction with amphoteric surfactants as regulators. There remains a need, however, for more effective regulators for maintaining more consistent alloy content and coating thickness along the surface of the platable materials. A difficulty in the prior art has been finding additives to regulate both thickness of alloy deposit and ratio of metal concentrations in alloy at low additive concentrations such that the additives do not contribute significantly to occluded carbon content of the deposit.

In some products, electrodeposited alloy may be subjected to a high temperature flow or fusion process capable of converting solder plate into a smooth bright coating. However, use of such a fusion process may be inappropriate for many electrical and electronic components including those electroplated with various alloys. To produce a bright electrodeposit on these products, selected additives must be formulated into the bath. Prior art additives for these purposes include numerous aldehydes such as formaldehyde, acetaldehyde, 3-hydroxy butyraldehyde, and chloro-substituted aromatic aldehydes. Although blends of these compounds are effective in producing a bright finish, they are also quite volatile and, under conditions of the plating operation, concentrations sufficient to constitute a health hazard may accumulate in the immediate environment.

OBJECTS OF THE INVENTION

It is accordingly an object of the present invention to provide an improved electroplating process for mass production of work pieces at high speed with minimal loss of electroplating solution.

It is another object of the invention to effectively regulate thickness of deposit and/or metal concentration of an alloy deposit with one or more additives held at low concentrations such that occluded carbon content of the deposit is not significantly affected.

It is another object of the invention to brighten the deposit resulting from the electroplating process without the use of highly volatile brighteners and without unacceptable environmental build-up of the brighteners.

It is a another object of the invention to reduce foam build up in electroplating baths used for commercial production.

It is a another object of the invention to reduce foaming without imparting impurities into the electroplate.

SUMMARY OF THE INVENTION

These and other objects are achieved by providing electroplating baths having one or more of the additives disclosed herein. Foaming may be reduced by including, as a grain refiner, nonionic surfactants which have no terminal hydroxy groups. In preferred embodiments, such grain refiners are analogous to terminal hydroxy-containing nonionic surfactants, differing only in that the terminal hydroxy groups have been replaced or blocked. Deposit thickness and/or composition of deposited alloys may be regulated by low concentrations in the electroplating bath of deposit regulating agents comprising at least one heteroaromatic compound having at least two nitrogen atoms. It is desired that these regulating agents cause the electrodeposit to be more consistent throughout its surface area as to the relative metal content of the alloy, or the deposit thickness, or preferably both. Preferably, these deposit regulators are capable of forming chelates with heavy metal cations. Brightening may be accomplished by utilizing dioxolanes. The additives of the invention may be added directly to the plating bath or they may be dissolved in a suitable solvent for use as a vehicle to introduce the additive to the bath.

The brighteners, grain refiners and deposit regulators each contribute advantages to the electroplating process and/or the electroplated product. While they are preferably utilized concurrently in the same electroplating solution, this is not necessary.

The deposit regulating agents regulate alloy content and deposit thickness even if the only nonionic grain refiners are those of the prior art. That is, the deposit regulators of the invention are functional even in the absence of the anti-foaming grain refiners which lack terminal hydroxy groups. They are also functional in the absence of the dioxolanes of the invention.

Improved electroplating methods result from utilizing one or more of the additives disclosed herein. Consistent alloy composition and thickness may result from electroplating processes utilizing the deposit regulating agents of the invention.

DETAILED DESCRIPTION OF CERTAIN PREFERRED EMBODIMENTS

In preferred embodiments of the invention, the brightening agent, deposit regulator, and modified grain refiners are all used together in a commercial electroplating bath which is part of a continuous system. A preferred bath in accordance with the invention includes components for depositing a tin/lead alloy. For instance, such a bath may include water soluble tin and lead salts such as methane sulfonates or fluoroborates Common tin/lead electroplating baths may include tin methane sulfonate, lead methane sulfonate, and methane sulfonic acid. The concentration of tin in the bath, as stannous methane sulfonate for instance, preferably ranges from about five grams per liter to about 100 grams per liter. The lead content, as plumbous methane sulfonate for instance, preferably ranges from about 3 to about 60 grams per liter. Methane sulfonic acid concentration preferably ranges from about 5 to about 200 grams per liter.

In accordance with the invention, starting materials for forming the novel grain refiners of the invention may be nonionic surfactants such as those used in the prior art having the general formula:

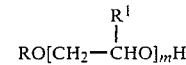

where R represents a $C_6$ to $C_{18}$ alkyl group; a $C_1$ to $C_{12}$ alkyl benzene, a beta-naphthalene nucleus, or a hydrogen atom; $R^1$ may be hydrogen or methyl, and m may be an integer between 3 and 30 These materials include a number of prior art nonionic surfactants which are used as grain refiners. While not intending to be bound by theory, it is believed that undesirable foaming characteristics associated with these prior art materials may be caused by the terminal hydroxyl group of these compounds. In preferred embodiments of the invention, Applicants introduce, into plating baths, analogs of terminal hydroxy-containing nonionic surfactants wherein the terminal hydroxyl group has been blocked or eliminated. It has been found that foaming of the bath may be reduced by using these modified grain refiners in place of, or in addition to, conventional grain refiners.

Certain compounds useful as anti-foaming grain refiners in accordance with the invention are commercially available. They may also be prepared by a variety of known techniques. For instance, known reactions involving hydroxyl group participation may be used to effect blocking or elimination of terminal hydroxy groups. Blocking or modification of the hydroxy group may, for instance, be accomplished by an etherifying radical, an acetalization of two hydroxy groups by low molecular aldehyde, or replacement of the hydroxy group by halogen.

Preffered anti-foaming nonionic grain refiners in accordance with the invention include, but are not limited to, those represented by the structural formula:

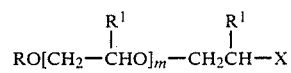

where R, $R^1$, and m have the same designations indicated above and X may be a halogen, alkoxy or aralkoxy.

Another valuable modified nonionic grain refiner useful in accordance with the invention belongs to the group where the terminal hydroxy groups have been reacted with a low molecular weight aldehyde to form an acetal. Preferred compounds of this class have the general formula:

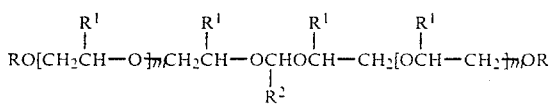

where R, $R^1$ and m have the designations indicated above and $R^2$ may be hydrogen, a $C_1$ to $C_4$ alkyl group, $CH_3CHOHCH_2$-phenyl or halogenated phenyl. These compounds may be synthesized in the laboratory by known methods. Some are commercially available.

Nonionic surfactants useful as anti-foaming grain refiners in accordance with the invention are available from Rohm & Haas Company, Philadelphia, Pa., under the tradenames "TRITON CF-54", "TRITON DF-18", "TRITON D-18", and "TRITON D-16". GAF Chemicals Corp. of Wayne, New Jersey offers a modified polyether under the tradename "ANTAROX F-330". PPG of Pittsburgh, Pennsylvania has available a series of polyether surfactants bearing the tradename "ALVANOL" in which the terminal hydroxy group has been replaced by halogen The nonionic surfactant Triton CF-76 (Rohm and Haas) is a commercially available, modified nonionic of the acetal type.

Use of the grain refiners of the invention has been shown to result in electroplating baths which not only exhibit less initial foaming, but also exhibit faster subsidence of foam initially formed. These grain refiners are preferably added to an electroplating bath in a concentration between about 1.0 grams/liter and 15.0 grams/liter, and most preferably between about 3.0 grams/liter and 8.0 grams/liter.

Deposit regulating compositions in accordance with the invention comprise heteroaromatic compounds having at least two nitrogen atoms. Preferred regulators include, but are not limited to, phenanthrolines, quinolines, and pyridyl compounds having at least two nitrogen atoms. The concentration of these compounds in the plating bath are preferably so low that they do not contribute to the occluded carbon content of the deposit. A preferred concentration in the plating bath is between about 0.001 grams/liter and about 1.0 grams/liter, most preferably between about 0.01 grams liter and about 0.5 grams/liter.

Preferred regulators display the beneficial unique property of forming strong chelates with copper, iron and other metal cations. Numerous species have proven effective in improving the plating characteristics of a tin/lead electroplating bath. Compounds useful as regulators include, but are not limited to, the following:

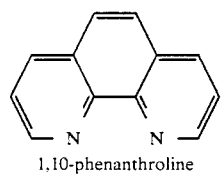
1,10-phenanthroline

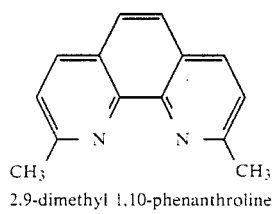
2,9-dimethyl 1,10-phenanthroline

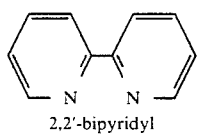
2,2'-bipyridyl

-continued

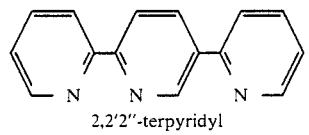
2,2'2''-terpyridyl

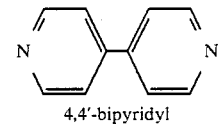
4,4'-bipyridyl

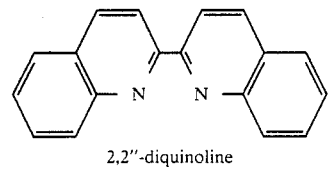
2,2''-diquinoline

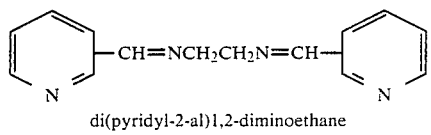
di(pyridyl-2-al)1,2-diminoethane

Dioxolane brighteners of the invention are effective without exhibiting the volatility and environmental pollution often associated with the prior art aldehydes used for this purpose. Preferred brighteners include but are not limited to those having the general formula:

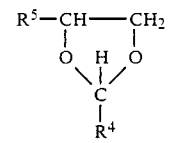

where $R_4$ may be hydrogen, $C_1$ to $C_4$ alkyl, phenyl, or substituted phenyl. $R_5$ may be hydrogen, methyl or hydroxymethyl. In certain preferred embodiments, $R_4$ is hydrogen, methyl, propyl, phenyl or chlorophenyl.

Dioxolanes are preferably added to an electroplating bath at a concentration of about 0.05 grams/liter to about 50 grams/liter and most preferably about 0.1 grams/liter to about 20 grams/liter Preferred dioxolanes include but are not limited to 1,3 dioxolanes, and substituted dioxolanes having as substituents methyl, hydroxymethyl and halophenyl groups.

EXAMPLE 1

Electroplating baths were prepared by known methods and provided with tin and lead salts for deposition of a tin/lead alloy. The foaming caused by a common prior art surfactant (50/50 mixture Neodol 91-6 (Shell) and Pluronic 64 (BASF), both of which are hydroxyl-containing nonionic surfactants) were compared to foaming characteristics for five baths which included surfactants which lack a terminal hydroxyl group in accordance with the invention. The experimental details and results are shown below in Table 1. The foam was generated by aeration.

TABLE 1
EFFECT OF MODIFIED NONIONIC SURFACTANTS ON FOAMING PROPERTIES OF Sn/Pb METHANE SULFONATE BATH[1]

| Additive | Additive gm/l | Sn gm/l | Pb gm/l | MSA gm/l | Foam Height initial | Foam Height after 5 min. |
|---|---|---|---|---|---|---|
| Control[2] | 1.8 | 20 | 10 | 178 | 30.5 cm | 21.5 cm |
| Triton DF-12 (An etherified nonionic) | 1.8 | 20 | 10 | 178 | 9.5 cm | 0 |
| Triton DF-18 (An etherified nonionic) | 1.8 | 20 | 10 | 178 | 20.5 cm | 0 |
| Triton CF-76 (Acetal-type non-ionic surfactant) | 1.8 | 20 | 10 | 178 | 20.5 cm | 7.5 cm |
| Antarox LF-330 (An etherified nonionic) | 1.8 | 20 | 10 | 178 | 17.5 cm | 0.5 cm |
| Alvanol 1525 (Nonionic with halo Substitution in place of terminal hydroxy | 1.8 | 20 | 10 | 178 | 28.3 cm | 13.0 cm |

[1] Foam generated by air going through a sintered glass at the rate of 900 ml./min. Total volume of Sn/Pb plating solution 100 ml. Diameter of tube = 7.5 cm. Foam height measured in centimeters.
[2] $C_{13}$ alcohol plus 9 moles of ethylene oxide (50%) and Pluronic L64 (BASF Wyandotte) (50%). This blend of nonionics is typical of prior art surfactants commonly used in Sn/Pb plating.

EXAMPLE 2

Tin/lead electroplating baths were prepared as shown below in Table 2. A workpiece having the indicated composition and geometry was electroplated in the bath under the conditions indicated in Table 2. Plate thickness was measured at various points by X-ray fluorescence. Variations in the deposit are as indicated in the Table.

TABLE 2
EFFECT OF HETEROAROMATICS ON THE ELECTRODEPOSITION OF A 60/40 Sn—Pb ALLOY AND THE VARIATION IN THICKNESS OF THE DEPOSIT WITH CURRENT DENSITY[1]

| Heteroaromatic | Additive gm/l | Pb gm/l | Sn gm/l | MSA gm/l | Sn content % | Variance | Variation in deposit thickness (microinches) 12–60 amps/ft[2] | Appearance of Plate #1 |
|---|---|---|---|---|---|---|---|---|
| Control[2] | 0 | 15.4 | 21 | 170 | 58.9 | ±3.4% | 350 | white matte |
| Phenanthroline[2] | 0.0075 | 15.4 | 21 | 170 | 60.6 | ±1.9% | 124 | white/grey matte |
| 2,2'-bipyridyl[2] | 0.020 | 15.4 | 19.5 | 170 | 62.4 | ±0.98% | 193 | white matte |
| 2,9-dimethyl[2] phenanthroline | 0.005 | 14.0 | 21.0 | 170 | 60.0 | ±2.0% | 313 | white/grey matte |
| 1:1 mixture of phenanthroline and bipyridyl[2] | 0.0175 | 14.0 | 21.0 | 170 | 59.1 | ±1.9% | 67 | white/grey matte |

[1] Tests were carried out in 267 ml. Hull cells, with agitation, at room temperature, and at 2 amps for 5 minutes. Tin and lead methane sulfonate were used as electrolyte. Substrates: 4½" × 2½" brass panels.
[2] All plating solutions contained a 5% nonionic surfactant which comprised a 1:1 mixture of Pluronic L64 and Alvenol 1525.

Brass panels were used to test electroplating baths containing the novel dioxolane brighteners of the invention. The specific bath formulations, experimental details and results are reported below.

EXAMPLES 3 & 4

| Bath Composition | Bath 3 | Bath 4 |
|---|---|---|
| Tin methane sulfonate (as Sn) | 54 gms/l. | 54 gms/l. |
| Lead methane sulfonate (as Pb) | 6 gms/l. | 6 gms/l. |
| 70% methane sulfonic acid | 177 gms/l. | 177 gms/l. |
| Pluronic L-64 | 2.0 gms/l. | 2.0 gms/l. |
| 2-methyl dioxolane | 55 gms/l. | 55 gms/l. |
| 1,2-dioxolane | 0 | 10 gms/l. |
| Plating conditions: | 267 ml Hull cell/brass panels | |
| Temperature: | (20–23° C.) | |
| Agitation: | Magnetic stirring bar | |
| Current: | 5 amps | |
| Time: | 2 minutes | |

Appearance of Deposits

Bath 3: A white semi-bright deposit over two-thirds of the panel.

Bath 4: A smooth mirror-bright deposit over one-half the panel.

EXAMPLE 5

Bath Composition Bath 5

| Bath Composition | Bath 5 |
| --- | --- |
| Tin methane sulfonate (as Sn) | 54.0 gms/l. |
| Lead methane sulfonate (as Pb) | 6.0 gms/l. |
| 70% methane sulfonic acid | 177 gms/l. |
| Pluronic L-43 | 1.5 gms/l. |
| Alvanol 1525 | 3.5 gms/l. |
| 2-methyl 4-hydroxymethyl dioxolane | 30 gms/l. |
| 4-hydroxymethyl 2-chlorophenyl dioxolane | 0.5 gms/l. |
| Plating conditions: | 267 Hull cell/4½": × 2/12" brass panel |
| Temperature: | (20–23° C.) |
| Agitation: | Magnetic stirring bar |
| Current: | 5 amps |
| Time: | 2 minutes |

Appearance of Deposit

Bath 5: A mirror-bright finish covering two-thirds of the panel.

EXAMPLES 6 & 7

| Bath Composition | Bath 6 | Bath 7 |
| --- | --- | --- |
| Tin methane sulfonate (as Sn) | 21.0 gms/l. | 21.0 gms/l. |
| Lead methane sulfonate (as Pb) 15.4 gms/l. | 15.4 gms/l. | |
| Methane Sulfonic acid | 177 gms/l. | 177 gms/l. |
| Pluronic L-43 | 1.5 gms/l. | 1 5 gms/l. |
| Alvanol 1525 | 3.5 gms/l. | 3.5 gms/l. |
| Phenanthroline | 0.008 gms/l. | 0.008 gms/l. |
| 1.3-dioxolane | 0 | 10 gms/l. |
| 2-methyl 1,3-dioxolane | 0 | 25 gms/l. |
| 4-hydroxymethyl 2-chlorophenyl dioxolane | | 0.01 gms/l. |
| Plating conditions: | 267 ml Hull cell/4½" × 2½" brass panel | |
| Temperature: | (20–23° C.) | |
| Agitation: | Magnetic stirring bar | |
| Current: | 2 amps | |
| Time: | 5 minutes | |

Appearance of Deposits

Bath 6: The tin-lead plate was a white matte finish covering 90% of the panel.

Bath 7: The tin-lead plate had a mirror-bright finish covering 60% of the panel from 10 amps/ft² to 70 amps/ft²

EXAMPLE 8

Semi-Bright Sn/Pb Plating Bath

| Tin methane sulfonate | 51.6 gms/liter |
| --- | --- |
| Lead methane sulfonate | 18.1 gms/liter |
| Alvanol 1525 | 1.0 gms/liter |
| Phenanthroline | 0.03 gms/liter |
| 2.2'-dipyridyl | 0.03 gms/liter |
| 2-(2'-chlorphenyl) 4-hydroxymethyl 1,3-dioxalane) | 0.006 gms/liter |

A brass Hull cell panel was plated in a 267 ml Hull cell at 5 amps for 1 minute.

A semi-bright plate was obtained from 250 amps/ft.² to 60 amps/ft.².

The terms and descriptions used herein are preferred embodiments set forth by way of illustration only, and are not intended as limitations on the many variations which those of skill in the art will recognize to be possible in practicing the present invention as defined by the following claims.

What is claimed is:

1. An electroplating bath comprising water-soluble tin and lead salts and an amount of a deposit regulating agent effective to improve electrodeposit consistency, said deposit regulating agent being selected from the group consisting of phenanthrolines, guinolines, pyridyl compounds, and combinations of the foregoing.

2. The electroplating bath according to claim 1, wherein said heteroarmatic compound is selected from the group consisting of 1,10-phenanthroline, 2,9-dimethyl 1,10-phenanthroline, 2,2'-bipyridyl, 2,2'2'''-terpyridyl, 4,4'-bipyridyl,2,2'-diquinoline, and di(pyridyl-2-al)1,2-diminoethane.

3. The electroplating bath according to claim 1, wherein the total concentration of said deposit regualting agent is between 0.001 and about 1.0 grams per liter.

4. The electroplating bath according to claim 1, wherein the total concentration of said deposit regulating agent is between 0.01 and about 0.5 grams per liter.

5. The electroplating bath according to claim 1 wherein said bath includes nonionic surfactants, at least a portion of which lack terminal hydroxy groups.

6. The electroplating bath according to claim 5 comprising from about 1.0 grams/liter to about 15.0 grams/liter of said nonionic surfactant, from about 0.05 grams/liter to about 50 grams/liter of a dioxolane brightener, and from about 0.01 grams/liter to about 1.0 grams/liter of said heteroaromatic compounds.

7. The electroplating bath according to claim 1, wherein said tin and lead salts are selected from the group consisting of methanesulfonate salts and fluoroborate salts.

8. An electroplating bath comprising water soluble tin and lead salts and an amount of a deposit regulating agent effective to improve electrodeposit consistency, said deposit regulating agent comprising at least one polycyclic heteroaromatic compound having at least two conjugated heterocyclic moieties, each of said heterocyclic moieties containing at least one nitrogen atom, wherein said bath comprises nonionic surfactants of the formula $$RO(CH_2-\overset{R_1}{\underset{|}{C}}HO)_m CH_2 \overset{R_1}{\underset{|}{C}}HX$$

wherein R represents a $C_6$ to $C_{18}$ alkyl group, a $C_1$ to $C_{12}$ alkyl benzene, a beta-naphthalene nucleus, or a hydrogen atom; $R^1$ may be hydrogen or methyl, and m may be an integer between 3 and 30, and wherein X is selected form the group consisting of halogen, alkoxy anp aralkoxy.

9. An electroplating bath comprising water soluble tin and lead salts and an amount of a deposit regulating agent effective to improve electrodeposit consistency, said deposit regulating agent comprising at least one polycyclic heteroaromatic compound having at least two conjugated heterocyclic moieties, each of said heterocyclic moieties containing at least one nitrogen atom, wherein said bath comprises nonionic surfactants of the formula $$(RO)CH_2\overset{R^1}{\underset{|}{C}}H-O)_m CH_2\overset{R^1}{\underset{|}{C}}H-OCH\overset{R^1}{\underset{|}{O}}CH-CH_2(OCH-CH_2)_m OR$$
$$\underset{R^2}{|}$$

wherein R is selected from the group consisting of a $C_6$ to $C_{18}$ alkyl group, a $C_1$ to $C_{12}$ alkyl benezene, a beta-naphthalene nucleus, and a hydrogen atom; $R^1$ may be hydrogen or methyl, m may be an integer between 3 and 30; and $R^2$ may be hydrogen, a $C_1$ to $C_4$ alkyl group, $CH_3CHOHCH_2$, phenyl or halogenated phenyl.

10. The electroplating bath according to claim 9 comprising from about 1.0 grams/liter to about 15.0 grams/liter of said nonionic surfactant, and from about 0.1 grams/liter to about 0.5 grams/liter of said heteroaromatic compounds, and further comprising a nonionic surfactant which includes terminal hydroxy groups.

11. An electroplating bath comprising water soluble tin and lead salts and an amount of a deposit regulating agent effective to improve electrodeposit consistency, said deposit regulating agent comprising at least one polycyclic heteroaromatic compound having at least two conjugated heterocyclic moieties, each of said heterocyclic moieties containing at least one nitrogen atom, wherein said bath further comprises dioxolane brighteners.

12. The electroplating bath according to claim 11, wherein said bath comprises dioxolanes of the formula

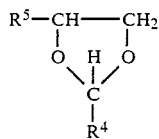

where $R_4$ is selected form the group consisting of hydrogen, $C_1$ to $C_4$ alkyl, aryl, and subsituted aryl; and $R_5$ is selected from the group consisting of hydrogen, methyl, and hydroxy methyl.

13. The electroplating bath according to claim 12, wherein $R_4$ is hydrogen, methyl, chlorophenyl, dichlorophenyl or naphthyl and $R_5$ is hydrogen, methyl or hydroxymethyl.

14. aprocess for producing a bright electrodeposit finish comprising contacting an eletroplatable object with an electroplating bath comprising:
 (1) tin and lead methane sulfonates;
 (2) an amount of a deposit regulating agent effective to imprive electrodeposit consistency, said agent comprising at least one polycyclic heteroaromatic compound having at least two conjugated heterocyclic moieties, each of said heterocyclic moieties containing at least one nitogen atom;
 (3) at least one nonionic surfactant lacking terminal hydroxy groups; and
 (4) a brightness-enhancing amount of at least one dioxolane compound.

15. The process of claim 14, wherein said tin and lead salts are independently selected from the group consisting of methane sulfonates, flouroborates, and mixtures thereof.

16. The process of claim 14, wherein said process results in a matte finish.

17. The process of claim 14, wherein said process results in a semi-bright finish.

18. The process of claim 14, wherein said process results in a mirror bright finish.

19. An electroplating process comprising contacting an electroplatable object with an electroplating bath containing water-soluble tin and lead salts, and from at least about 0.001 grams/liter to about 1.0 grams/liter of a deposit regualting composition which comprises at least one polycyclic heteroaromatic compound having at least two conjugated heterocyclic moieties, each of said heterocyclic moieties containing at least one nitrogen atom wherein said bath further comprises at least one dioxlane brightener.

20. The process of claim 19, wherein said bath further comprises at least one nonionic surfactant which lacks terminal hydroxy groups.

* * * * *

UNITED STATES PATENT AND TRADEMARK OFFICE
CERTIFICATE OF CORRECTION

PATENT NO. : 4,923,576

DATED : May 8, 1990

INVENTOR(S) : Harry Kroll, et al.

It is certified that error appears in the above-identified patent and that said Letters Patent is hereby corrected as shown below:

Col. 5, lines 7-8, change "ALVANOL" to --AVANEL--.

Col. 7, line 23, change "Alvanol" to --Avanel--;
      line 24, change "1525" to --N-1525--;
      line 60, change "Alvenol 1525" to --Alvanel N-1525--.

Col. 9, line 6, change "Alvanol 1525" to --Alvanel N-1525--;
      line 25, change "Alvanol 1525" to --Alvanel N-1525--;
      line 47, change "Alvanol 1525" to --Alvanel N-1525--.

Signed and Sealed this

Eleventh Day of December, 1990

*Attest:*

HARRY F. MANBECK, JR.

*Attesting Officer*      *Commissioner of Patents and Trademarks*